United States Patent
Mundra et al.

(10) Patent No.: US 10,267,846 B1
(45) Date of Patent: Apr. 23, 2019

(54) PRINTED CIRCUIT BOARD (PCB) INTERCONNECT DEFECT DETECTION

(71) Applicant: EMC Corporation, Hopkinton, MA (US)

(72) Inventors: Rohit Mundra, Marlborough, MA (US); Jeffrey J. LeBlanc, Grafton, MA (US); Christopher A. Goonan, Westborough, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 513 days.

(21) Appl. No.: 14/586,176

(22) Filed: Dec. 30, 2014

Related U.S. Application Data

(60) Provisional application No. 61/987,791, filed on May 2, 2014.

(51) Int. Cl.
*G01R 31/28* (2006.01)
*G06F 19/00* (2018.01)
*G06F 17/50* (2006.01)

(52) U.S. Cl.
CPC ........... *G01R 31/281* (2013.01); *G06F 17/50* (2013.01); *G06F 19/00* (2013.01)

(58) Field of Classification Search
CPC ........ G06F 19/00; G06F 17/50; G01R 31/281
See application file for complete search history.

(56) References Cited

U.S. PATENT DOCUMENTS

| | | | |
|---|---|---|---|
| 2007/0038969 A1* | 2/2007 | Pitkary | G01R 31/281 324/763.01 |
| 2009/0240450 A1* | 9/2009 | Tsai | H05K 1/0201 702/64 |
| 2010/0332169 A1* | 12/2010 | Liang | G01R 31/2805 702/65 |
| 2012/0197583 A1* | 8/2012 | Liang | G01R 31/2801 702/125 |

* cited by examiner

*Primary Examiner* — Ajay Ojha
(74) *Attorney, Agent, or Firm* — Krishnendu Gupta; Lesley Leonessa

(57) ABSTRACT

A system, computer program product, and computer-executable method for detecting defects in an interconnect, the system, computer program product, and computer-executable method comprising receiving a data measurement relating to the interconnect, analyzing the data measurement, and determining whether the interconnect includes a defect based on the analyzing of the data measurement isolated from the impedance of the interconnect.

12 Claims, 20 Drawing Sheets

PRINTED CIRCUIT BOARD (PCB) INTERCONNECT DEFECT DETECTION

A portion of the disclosure of this patent document may contain command formats and other computer language listings, all of which are subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

RELATED APPLICATION

This Application claims priority from Provisional Application Ser. No. 61/987,791 filed on May 2, 2014 entitled "TRACK RESISTANCE ANALYSIS," the content and teachings of which are hereby incorporated by reference in their entirety.

TECHNICAL FIELD

This invention relates to data storage.

BACKGROUND

Computer systems are constantly improving in terms of speed, reliability, and processing capability. As is known in the art, computer systems which process and store large amounts of data typically include a one or more processors in communication with a shared data storage system in which the data is stored. The data storage system may include one or more storage devices, usually of a fairly robust nature and useful for storage spanning various temporal requirements, e.g., disk drives. The one or more processors perform their respective operations using the storage system. Mass storage systems (MSS) typically include an array of a plurality of disks with on-board intelligent and communications electronics and software for making the data on the disks available.

Companies that sell data storage systems and the like are very concerned with providing customers with an efficient data storage solution that minimizes cost while meeting customer data storage needs. It would be beneficial for such companies to have a way for reducing the complexity of implementing data storage.

SUMMARY

A system, computer program product, and computer-executable method for detecting defects in an interconnect, the computer-executable method comprising receiving a data measurement relating to the interconnect, analyzing the data measurement, and determining whether the interconnect includes a defect based on the analyzing of the data measurement.

BRIEF DESCRIPTION OF THE DRAWINGS

Objects, features, and advantages of embodiments disclosed herein may be better understood by referring to the following description in conjunction with the accompanying drawings. The drawings are not meant to limit the scope of the claims included herewith. For clarity, not every element may be labeled in every figure. The drawings are not necessarily to scale, emphasis instead being placed upon illustrating embodiments, principles, and concepts. Thus, features and advantages of the present disclosure will become more apparent from the following detailed description of exemplary embodiments thereof taken in conjunction with the accompanying drawings in which:

Like reference symbols in the various drawings indicate like elements.

DETAILED DESCRIPTION

Traditionally, during the fabrication process Printed Circuit Boards (PCBs), electrical interconnects on each PCB are tested for impedance. Conventionally, testing electrical interconnects is difficult because traditional testing methodologies for detecting impedance and defects in electrical interconnects often do not distinguish between track resistance and detected defects within the interconnect. Typically, improving the ability to accurately measure impedance of a high-speed interconnect would be beneficial to the data storage system industry.

Conventionally, interconnects on a PCB are tested by determining characteristic impedance of each interconnect. Typically, PCB manufacturers are looking for uniform interconnects where its characteristic impedance is constant along the direction of signal propagation. Traditionally, an interconnect is considered non-uniform when its characteristic impedance is not constant along the direction of signal propagation. Generally, there are many reasons why an interconnect may have a non-constant characteristic impedance. Conventionally, manufacturing defects can cause an interconnect to have a non-constant characteristic impedance. Typically, manufacturing defects can manifest when an interconnect is not of uniform size. Generally, a thicker portion of an interconnect will have a lower impedance, which contributes to the non-uniformity of the interconnect. Conventionally, manufacturing defects can manifest when the material of the interconnect is not placed in a straight line.

Figure 1:
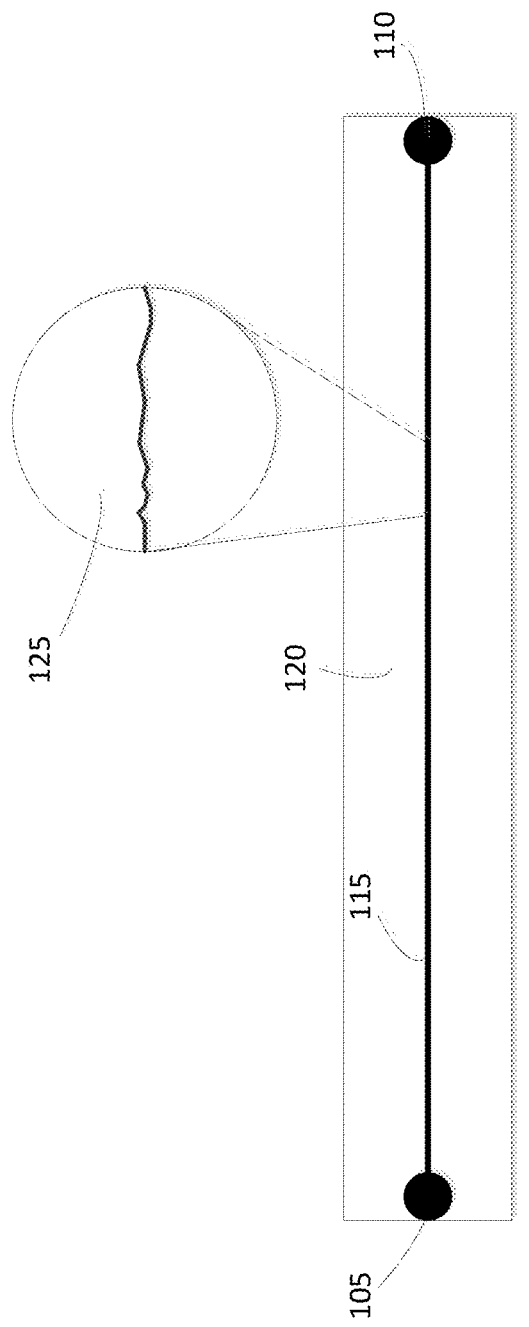
FIG. 1 is a simplified illustration of a magnified portion of an interconnect, in accordance with an embodiment of the present disclosure.

Refer to the example embodiment of FIG. 1. FIG. 1 is a simplified illustration of a magnified portion of an interconnect, in accordance with an embodiment of the present disclosure. As shown, Printed Circuit Board (PCB) 120 includes electrical interconnect 115. Electrical interconnect 115 includes endpoint 105 and endpoint 110. Portion 125 is a magnified portion of electrical interconnect 115. In this embodiment, while electrical interconnect 115 looks straight and regularly formed, portion 125 shows that electrical interconnect 115 includes imperfections.

Traditionally, besides manufacturing defects, track resistance can cause variations in impedance measurements which can create difficulties when comparing a modeled PCB layout with a manufactured product. Generally, when testing one or more interconnects on a PCB, manufacturing defects combined with track resistance make it difficult to determine what is causing variations in an interconnects impedance.

In many embodiments, the current disclosure may enable a user to utilize one or more techniques to remove track resistance and accurately measure impedance of one or more interconnects on a manufactured Printed Circuit Board (PCB). In various embodiments, the current disclosure may enable a user to accurately determine an impedance of an interconnect using a single measurement of the interconnect. In most embodiments, the current disclosure may enable a user to accurately determine an impedance of an interconnect using two or more measurements of an interconnect. In many embodiments, the current disclosure may enable measurement of actual impedance of an interconnect without track resistance.

In many embodiments, the current disclosure may enable creation of an analysis system which may be enabled to remove and/or isolate track resistance from impedance measurements of an interconnect on a PCB. In various embodiments, an analysis system may include an input module for receiving impedance data of an interconnect in one or more formats. In certain embodiments, an analysis system may include an analysis module which may be enabled to analyze impedance data to determine track resistance and/or remove track resistance from the impedance data. In other embodiments, an analysis module may be enabled to estimate impedance of an interconnect using one or more impedance measurements. In certain embodiments, an analysis module may be enabled to smooth, change, and/or modify impedance data based on one or more parameters. In some embodiments, an analysis module may be enabled to identify and/or remove measurement noise from impedance measurements.

In many embodiments, an analysis system may include an output module that may be enabled to output analyzed data to one or more formats, including, but not limited to Comma Separated Values (CSV), text files, spreadsheets, Extensible Markup Language file (XML) and/or other industry standard formats. In most embodiments, an analysis system may utilize a measurement instrument that may enable characterization of high-speed electrical interconnects, such as a Time-Domain Reflectometer (TDR). In other embodiments, a TDR may inject a pulse into an electrical interconnect to measure impedance determined the timing and value of reflections from discontinuities.

In various embodiments, an analysis system may communicate with a Time-Domain Reflectometer (TDR) to retrieve impedance data related to an interconnect on a PCB. In most embodiments, an analysis system may be enabled to communicate with a TDR to retrieve impedance data related to high speed cabling, such as, but not limited to, USB, HDMI, SAS, and/or other industry standard high speed cable types. In certain embodiments, an analysis system may receive one or more sets of impedance data from a TDR. In other embodiments, an analysis system may receive impedance data from a beginning of an interconnect and an end of an interconnect.

Iteratively Re-Weighted Least Squares (IRWLS) Fitting

In many embodiments, the current disclosure may enable an analysis system to apply an Iteratively Re-Weighted Least Squares (IRWLS) method which may be able to closely identify impedance as well as track resistance, thereby gating out noise present in impedance measurements. For example, in an embodiment, an analysis module may implement the following IRWLS. Model the measured impedance.

$$Z_{measured}(t) = Z_{in} + tZ_{track} + \tilde{v} \quad \text{(Step 1)}$$

Where $Z_{measured}(t)$ is the measured impedance at a specified time, $Z_{in}$ is the Impedance at the input of the measured electrical interconnect, t is time, Z the track resistance per unit time (i.e. $Z_{track}$ is slope), and $\tilde{v}$ is the manufacturing variation and other noise. Solve the over-determined system of equations for $Z_{in}$ and $Z_{track}$ to minimize the error terms $\tilde{v}$.

$$\begin{bmatrix} Z_{measured}(t^{(1)}) \\ \vdots \\ Z_{measured}(t^{(n)}) \end{bmatrix} = \begin{bmatrix} 1 & t^{(1)} \\ \vdots & \vdots \\ 1 & t^{(n)} \end{bmatrix} \begin{bmatrix} Z_{in} \\ Z_{track} \end{bmatrix} + \begin{bmatrix} \hat{v}^{(1)} \\ \vdots \\ \hat{v}^{(n)} \end{bmatrix} \quad \text{(Step 2)}$$

$$\begin{bmatrix} Z_{in} \\ Z_{track} \end{bmatrix} \approx \begin{bmatrix} 1 & t^{(1)} \\ \vdots & \vdots \\ 1 & t^{(n)} \end{bmatrix}^t \begin{bmatrix} Z_{measured}(t^{(1)}) \\ \vdots \\ Z_{measured}(t^{(n)}) \end{bmatrix}$$

Multiply each equation by weight term ($w^t$).

$$Z_{measured}(t) = Z_{in} + tZ_{track} + \hat{v} \text{ and} \quad \text{(Step 3)}$$

$$w^t = \frac{1}{|Z_{measured}(t) - Z_{in} + tZ_{track}|}$$

Step 4, Repeat steps 2 and 3 to get a new estimate $$\begin{bmatrix} Z_{in\_New} \\ Z_{track\_New} \end{bmatrix}$$

while convergence criteria is not met. The convergence criteria is met when the following equation is true.

$$\left\| \begin{bmatrix} Z_{in\_New} \\ Z_{track\_New} \end{bmatrix} - \begin{bmatrix} Z_{in} \\ Z_{track} \end{bmatrix} \right\| < \in$$

where $\in$ is on the order of $10^{-4}$.

In this embodiment, after convergence, gating is performed by eliminating consecutive equations with weights that are below $|0.1Z_{target}|^{-1}$ (height threshold). In many embodiments, gating may be performed if the consecutive measurements have below-tolerance weights for a minimum time period. In various embodiments, after gating, IRWLS may be performed on the remaining equations (steps 2-4) to get a final estimate of $Z_{in}$ and $Z_{track}$.

Figure 2:
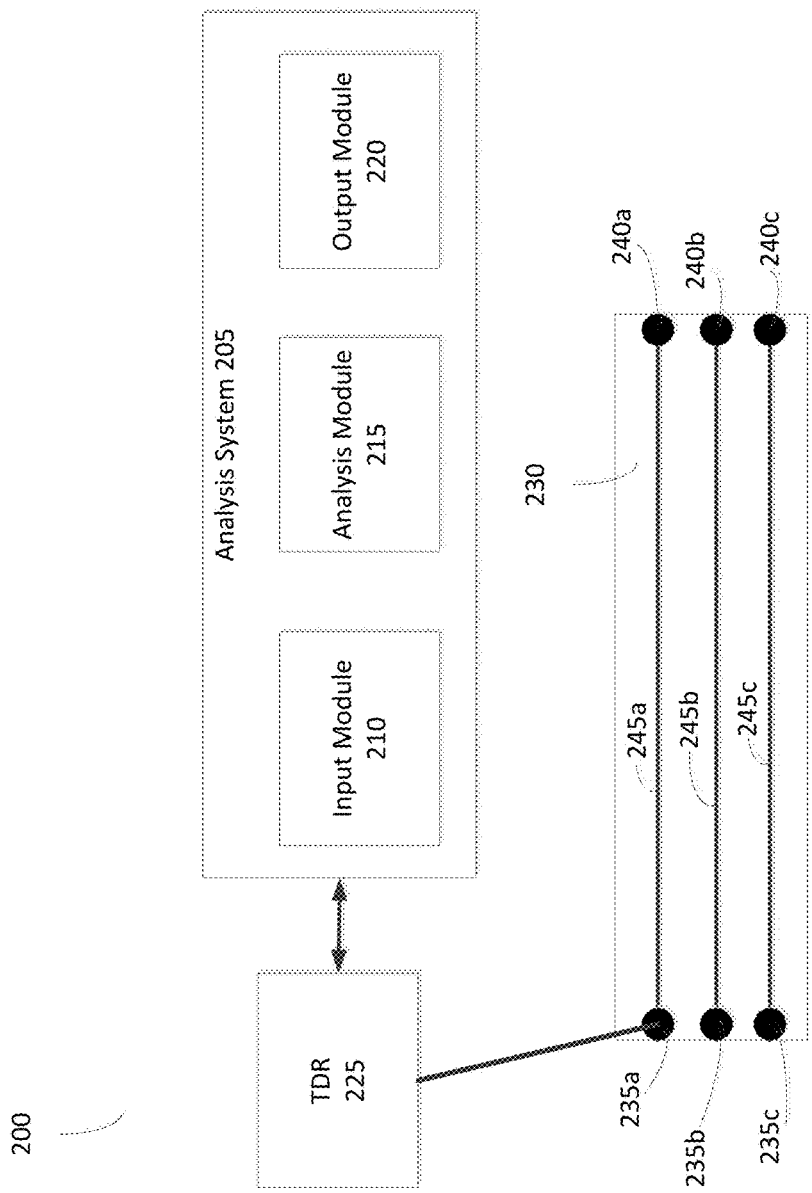
FIG. 2 is a simplified illustration of an Impedance Analysis System analyzing a Printed Circuit Board (PCB), in accordance with an embodiment of the present disclosure.

Refer to the example embodiment of FIG. 2. FIG. 2 is a simplified illustration of an Impedance Analysis System analyzing a Printed Circuit Board (PCB), in accordance with an embodiment of the present disclosure. As shown, Impedance Analysis System 200 includes Time-Domain Reflectometer (TDR) 225 and analysis system 205. Analysis system 205 includes input module 210, analysis module 215, and output module 220. TDR 225 is enabled to be coupled to Printed Circuit Board (PCB) 230. PCB 230 includes electrical interconnects (245a-c, 245 generally). Electrical interconnect 245a includes endpoint 235a and endpoint 240a. Electrical interconnect 245b includes endpoint 235b and endpoint 240b. Electrical interconnect 245c includes endpoint 235c and endpoint 240c.

In FIG. 2, TDR 225 is enabled measure impedance of electrical interconnects 245 on PCB 230. TDR 225 is enabled to provide data related to impedance measurements of electrical interconnects 245 to input module 210 of analysis system 205. Input Module 210 is enabled to communicate received data to analysis module 215. Analysis module 215 is enabled to analyze the received data and augment the received data to remove errors acquired while TDR 225 was measuring electrical interconnects 245. Analysis system 205 is enabled to output augmented data using output module 220.

Figure 3:
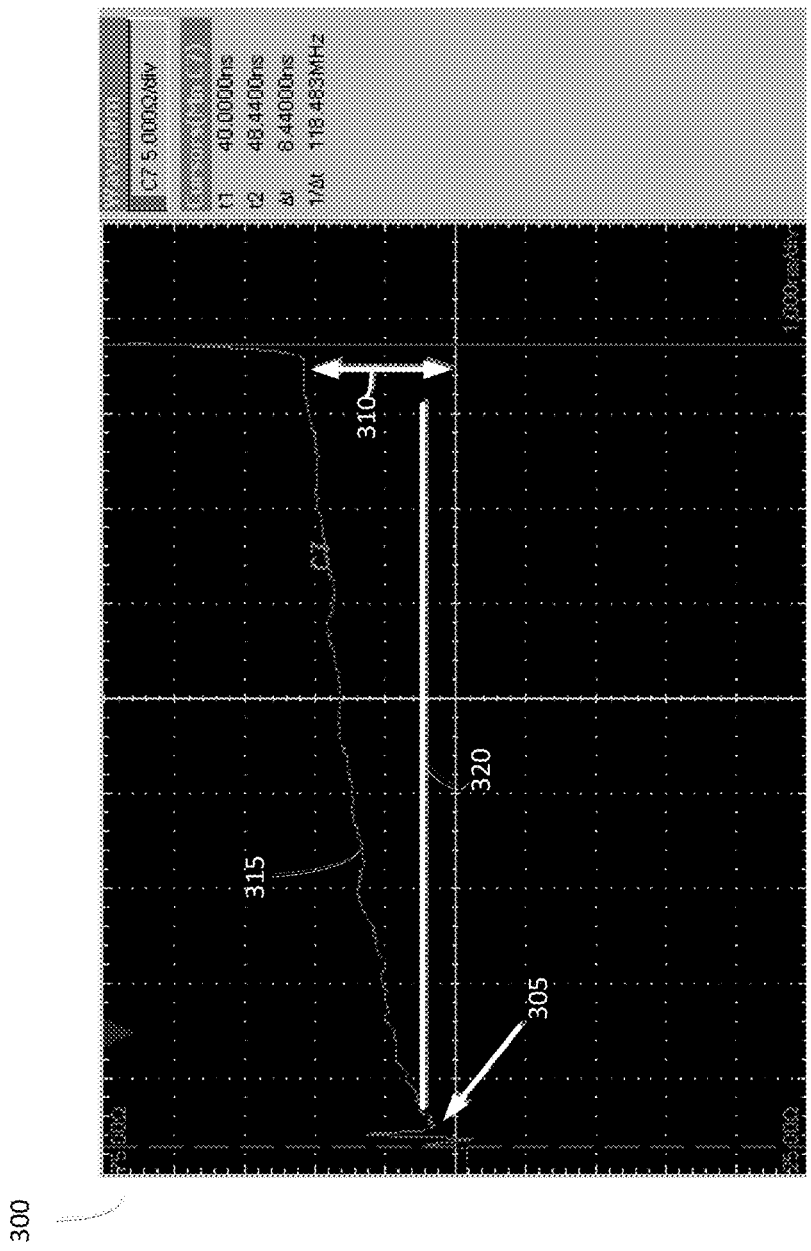
FIG. 3 is a simplified graph of an impedance measurement from a Time-Domain Reflectometer (TDR), in accordance with an embodiment of the present disclosure.

Refer to the example embodiment of FIG. 3. FIG. 3 is a simplified graph of an impedance measurement from a Time-Domain Reflectometer (TDR), in accordance with an embodiment of the present disclosure. Graph 300 shows a measurement of impedance over the distance of an electrical interconnect. Line 315 is measured impedance showing an increase in impedance over time. In many embodiments, an accumulation of track resistance of measured impedance may be caused by the distance travelled by the impedance measurement signal. In most embodiments, artifacts in a measurement of impedance may show defects in an electrical interconnect. Arrow 305 is showing the impedance measured at time zero. Arrow 310 shows the deviation over time of from the impedance measured at time zero. Upon processing the measured impedance data shown by line 315, graph of the processed measured impedance data will stay closer to line 320, which is at the approximate value of the initial measured impedance, pointed to by arrow 305.

Figure 4:
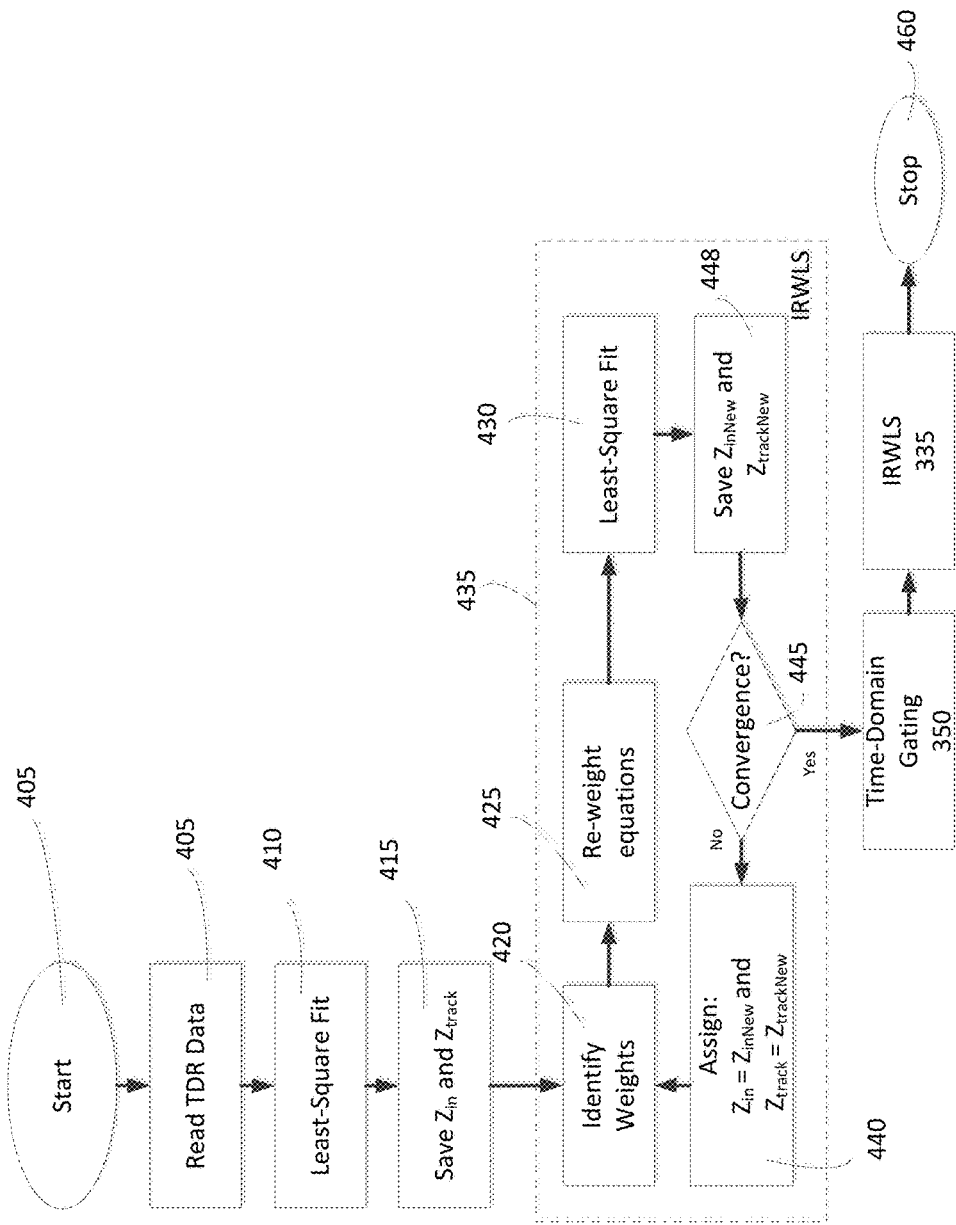
FIG. 4 is a simplified flow-chart of an analysis system processing measured impedance of an electrical interconnect, in accordance with an embodiment of the present disclosure.

Refer to the example embodiment of FIG. 4. FIG. 4 is a simplified flow-chart of an analysis system processing measured impedance of an electrical interconnect, in accordance with an embodiment of the present disclosure. As shown, an analysis system reads TDR data (Step 405) and initially conducts a least square fit (Step 410) on the received TDR data. The analysis system initializes internal variables and saves $Z_{in}$ and $Z_{track}$ (Step 415). In this embodiment, $Z_{in}$ is the initial impedance and $Z_{track}$ is the track resistance per unit time. The analysis system processes the TDR data in an analysis module executing Iteratively Re-Weighted Least Squares (IRWLS) (Steps 435). IRWLS (Steps 435) includes identifying weights (Step 420), re-weighting equations (Step 425), executing a least square fit on the updated TDR data (Step 430), saving the new $Z_{in}$ and the new $Z_{track}$ data (Step 448). The Analysis module determines whether the data analyzed with the new $Z_{in}$ and the new $Z_{track}$ meets the convergence criteria (Step 445). If convergence criteria is not met, new $Z_{in}$ and the new $Z_{track}$ are assigned to $Z_{in}$ and $Z_{track}$ and the IRWLS (Steps 440) are repeated until the convergence criteria is met. If convergence criteria is met, the analysis system is enabled to perform gating if the consecutive measurements have below-tolerance weights for a minimum period (Step 450) and is enabled to perform IRWLS 435 repeatedly to get a final estimate of $Z_{in}$ and $Z_{track}$.

Figure 5:
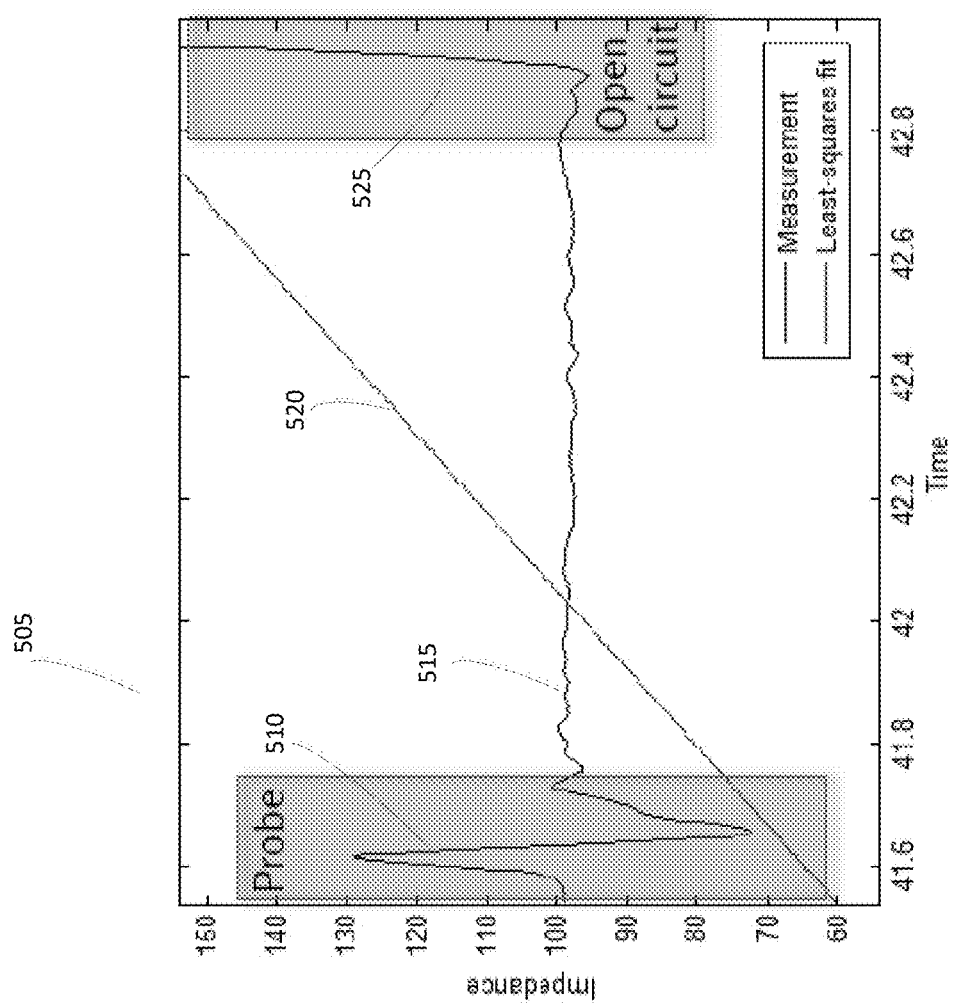
FIG. 5 shows a simplified illustration of a graph of measured impedance of an electrical interconnect, in accordance with an embodiment of the present disclosure.

Refer to the example embodiment of FIG. 5. FIG. 5 shows a simplified illustration of a graph of measured impedance of an electrical interconnect, in accordance with an embodiment of the present disclosure. Line 515 on Graph 505 shows measured impedance of an electrical interconnect over time. As shown, line 520 shows an initial least squares fit on line 515 of Graph 505. In this embodiment, a simple least squares fit does not smooth out the Graph 505 of measured impedance because of noise present in measurements. Portion 510 of graph 505 is noise created by the probe used to measure the impedance of the electrical interconnect. Portion 525 of graph 505 shows noise created by the open circuit. The noise at portion 510 and portion 525 causes line 520 to be skewed.

Figure 6:
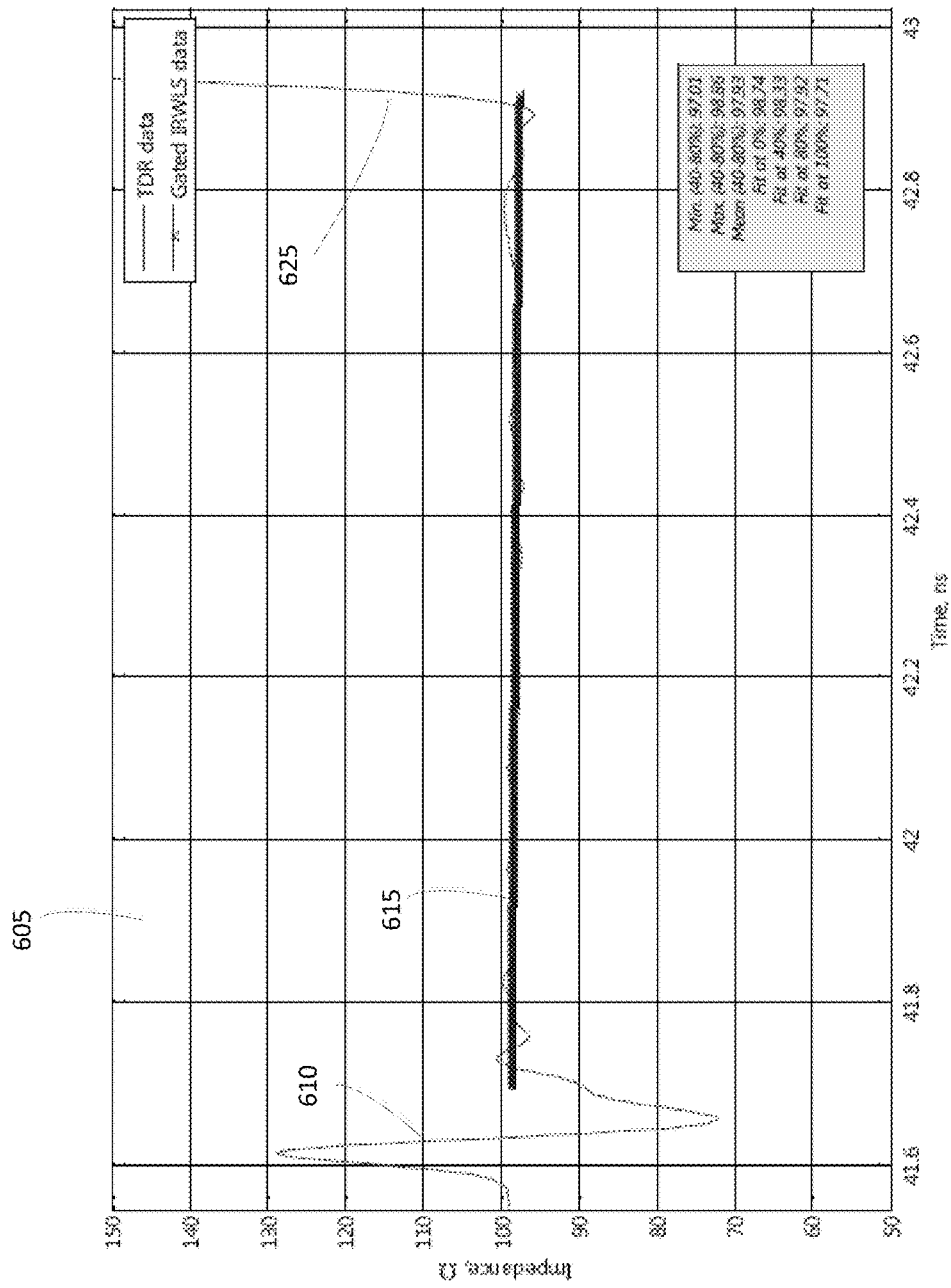
FIG. 6 is a simplified illustration of a graph of measured impedance of an electrical interconnect after being processed by an analysis module, in accordance with an embodiment of the present disclosure.

Refer to the example embodiment of FIG. 6. FIG. 6 is a simplified illustration of a graph of measured impedance of an electrical interconnect after being processed by an analysis module, in accordance with an embodiment of the present disclosure. Line 615 shows a least squares fit on Graph 605. Comparing graph 605 to FIG. 6, Line 615 disregards outlier portion 610 and portion 625 which would skew the impedance measurements shown by Graph 605.

De-Embedding Track Resistance

In many embodiments, the current disclosure may enable an analysis system to de-embed track resistance, thereby gating out noise present in impedance measurements. In various embodiments, an analysis system may be enabled to utilize two measurements of an interconnect and de-embed track resistance in impedance measurement collected by a TDR from the interconnect.

Figure 7A:
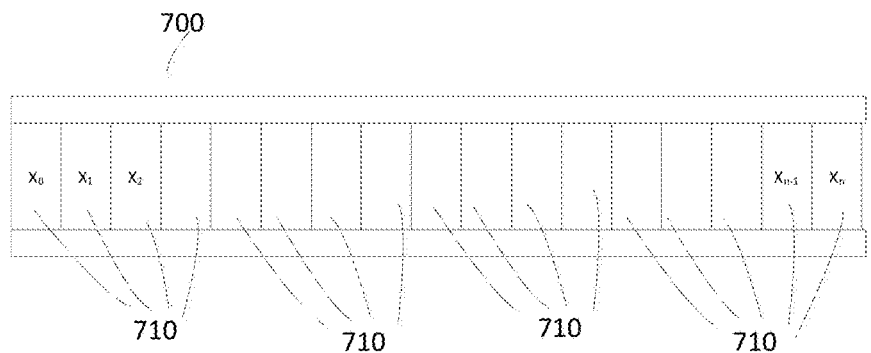
FIG. 7A is a simplified illustration of an electrical interconnect being analyzed, in accordance with an embodiment of the present disclosure.

Refer to the example embodiment of FIG. 7A. FIG. 7A is a simplified illustration of an electrical interconnect being analyzed, in accordance with an embodiment of the present disclosure. As shown, electrical interconnect 700 is comprised of portions 710 which are labelled by $X_0$ through $X_n$. As shown, each of portions 710 are enabled to be used to analyze electrical interconnect 700.

In an embodiment, an interconnect may be divided into one or more portions which may be modeled. In this embodiment, measurements of an interconnect may have portions $X_0$ through $X_n$, as shown in FIG. 7, which may be modeled by the following equations.

$$\begin{bmatrix} Z_0(X_0) + 0 \cdot Z_{track} \\ Z_0(X_1) + 1 \cdot Z_{track} \\ Z_0(X_2) + 2 \cdot Z_{track} \\ \vdots \\ Z_0(X_N) + N \cdot Z_{track} \end{bmatrix} \quad \text{(Equation 1)}$$

and $$\begin{bmatrix} Z_0(X_N) + 0 \cdot Z_{track} \\ Z_0(X_{N-1}) + 1 \cdot Z_{track} \\ Z_0(X_{N-2}) + 2 \cdot Z_{track} \\ \vdots \\ Z_0(X_0) + N \cdot Z_{track} \end{bmatrix} \quad \text{(Equation 2)}$$

In this embodiment, equation 1 is a vector representation of impedance measured from a first end of an interconnect and equation 2 is a vector representation of impedance measured from a second end of the interconnect. As shown, Equations 1 and 2 are manipulated to remove track resistance from the measurements. Equation 3 is Equation 2 where each term is flipped, such that Equation 3 starts with the $X_0$ term and finishes with the $X_n$ term.

$$\begin{bmatrix} Z_0(X_0) + N \cdot Z_{track} \\ Z_0(X_1) + (N-1) \cdot Z_{track} \\ Z_0(X_2) + (N-2) \cdot Z_{track} \\ \vdots \\ Z_0(X_N) + 0 \cdot Z_{track} \end{bmatrix} \quad \text{(Equation 3)}$$

Equation 4 is Equation 1 subtracting Equation 3.

$$\begin{bmatrix} -N \cdot Z_{track} \\ (-N+2) \cdot Z_{track} \\ (-N+4) \cdot Z_{track} \\ \vdots \\ N \cdot Z_{track} \end{bmatrix} \quad \text{(Equation 4)}$$

Equation 5 is equation 4 divided by 2.

$$\begin{bmatrix} -N/2 \\ \vdots \\ -N/2 \end{bmatrix} Z_{track} + \begin{bmatrix} 0 \\ 1 \\ \vdots \\ N \end{bmatrix} Z_{track} \quad \text{(Equation 5)}$$

Through this process, track resistance is isolated from the measured impedance on an interconnect.

In many embodiments, once equation 5 may be produced, a robust regression technique may be applied, such as the robust locally weighted scatterplot smoothing, to reduce noise present in Equation 5. In various embodiment, the product equation of equation 5 may be offset by removing $(-N/2)Z_{track}$ to isolate the track resistance term. In most embodiments, the offset of equation 5 may be subtracted from the original measurement to compensate for track resistance and de-embed the track resistance.

Figure 8:
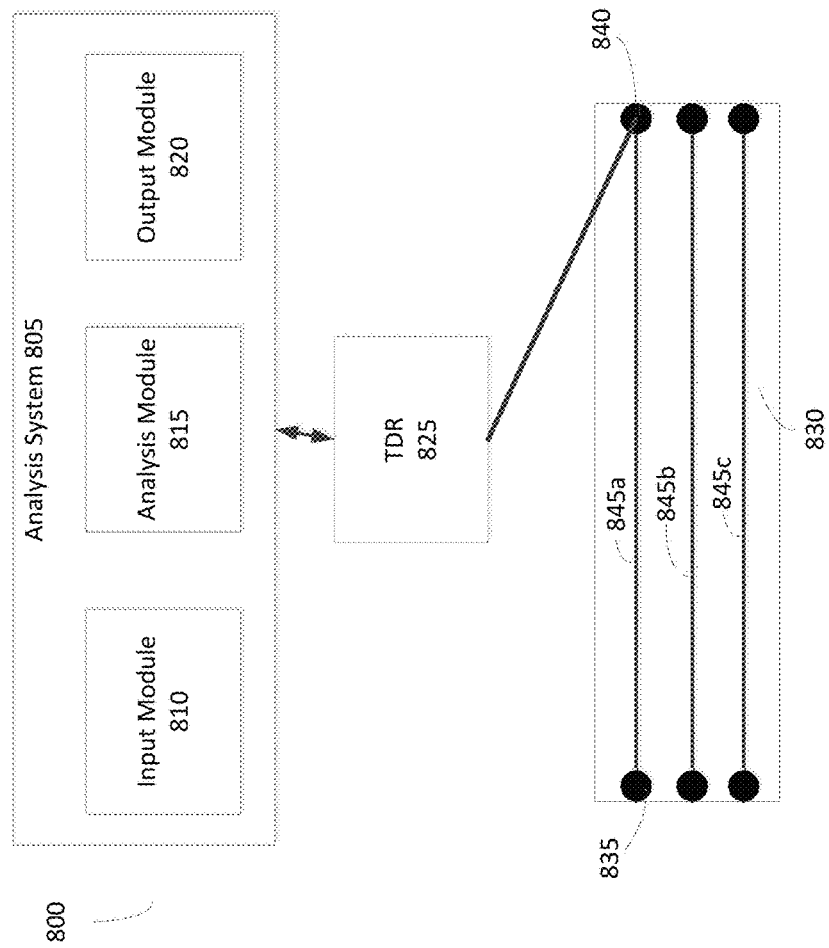
FIG. 8 is a simplified illustration of an analysis system processing impedance measurements on an electrical interconnect on a Printed Circuit Board (PCB), in accordance with an embodiment of the present disclosure.

Refer to the example embodiment of FIG. 8. FIG. 8 is a simplified illustration of an analysis system processing impedance measurements on an electrical interconnect on a Printed Circuit Board (PCB), in accordance with an embodiment of the present disclosure. As shown, Analysis system 805 is in communication with Time-Domain Reflectometer (TDR) 825. PCB 830 includes electrical interconnects (845a-c, 845 generally). As shown, TDR 825 is enabled to measure impedance on electrical interconnect 845a using connection 835. TDR 825 is enabled to measure impedance on electrical interconnect 845a using connection 840. Analysis system 805 is enabled to analyze bi-directional measurements of electrical interconnect 845a from two or more measurements made on electrical interconnect 845a. TDR 825 communicates measured impedance to input module 810 in analysis system 805. Input module 810 provides the measured impedance to analysis module 815, which processes the measured impedance and removes noise acquired during the measurement process. Analysis system 805 is enabled to output processed impedance values of interconnect 845a using output module 820.

Figure 9:
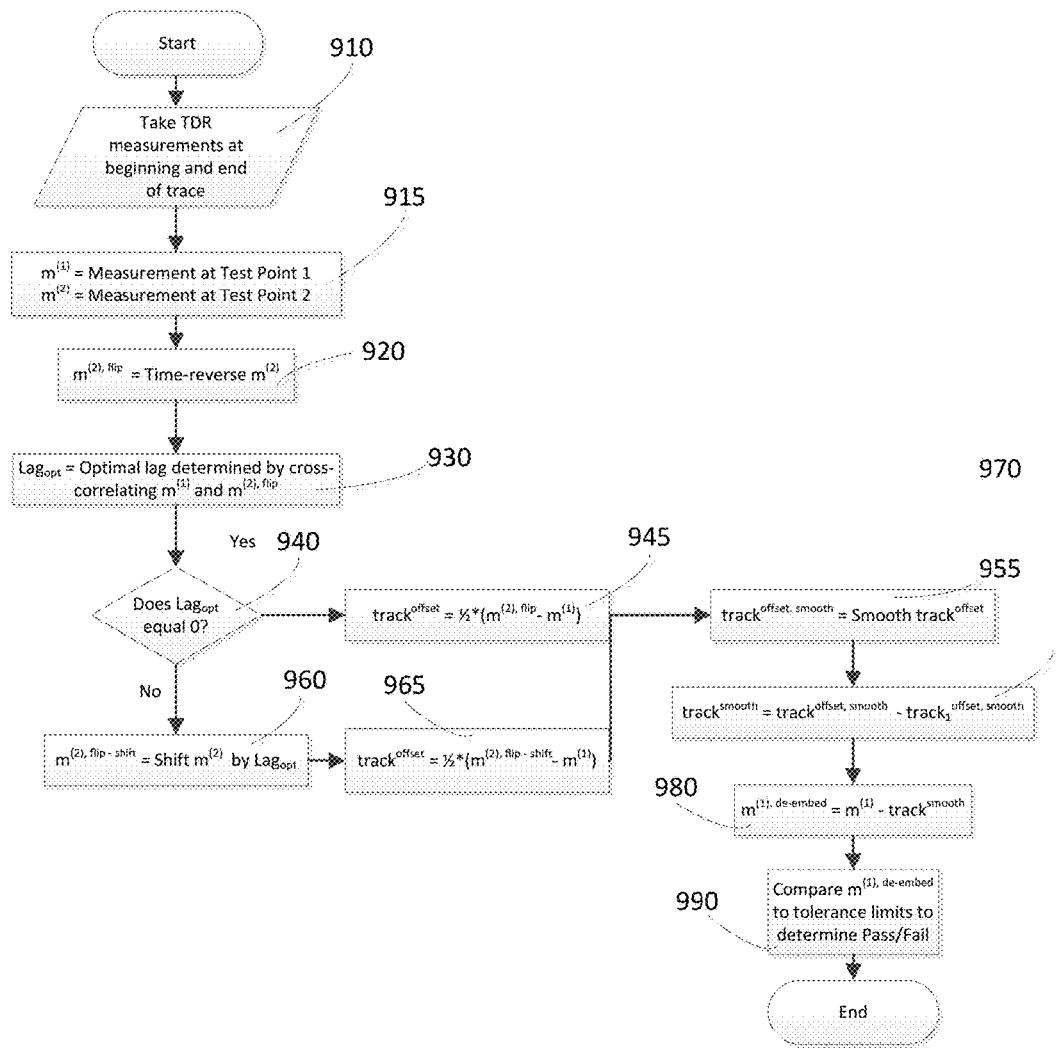
FIG. 9 is a simplified flowchart of a method of processing measured impedance of an electrical interconnect as shown in FIG. 8, in accordance with an embodiment of the present disclosure.

Refer to the example embodiments of FIGS. 8 and 9. FIG. 9 is a simplified flowchart of a method of processing measured impedance of an electrical interconnect as shown in FIG. 8, in accordance with an embodiment of the present disclosure. As shown, TDR 825 (FIG. 8) takes measurement $m^{(1)}$ of electrical interconnect 845a from connection 835 and takes measurement $m^{(2)}$ from connection 840 (Step 910), where measurements of impedance are recorded over a period of time (Step 915). TDR 825 communicates measurement data to analysis system 805. Analysis system 805 processes received measurement data using analysis module 815.

As shown, Analysis module 815 reflects $m^{(2)}$ the vertical axis (Step 920). Analysis module 815 cross correlates $m^{(1)}$ and $m^{(2),flip}$ to determine whether lag appears when comparing measurements (Step 930). Upon determination that a lag does not exist (Step 940), analysis module 815 subtracts $m^{(1)}$ from $m^{(2),flip}$ and divides the result by 2 (Step 945) and then smoothes the resultant data (Step 955). Upon determination that a lag exists (Step 940), analysis module 815 shifts $m^{(2),flip}$ by the determined amount of lag (Step 960) and analysis module 815 subtracts $m^{(1)}$ from $m^{(2),flip-shift}$ and divides the result by 2 (Step 965) and then smoothes the resultant data (Step 955). Analysis module 815 removes the offset from the smoothed resultant data to isolate Track resistance (Step 970) and de-embeds track resistance from the $m^{(1)}$ measurement (Step 980) to show trace impedance on interconnect 845a. Analysis module 815 compares $m^{(1)}$, $_{de-embed}$ to target impedance tolerance limits to determine whether interconnect 845a passed or failed.

Figure 10:
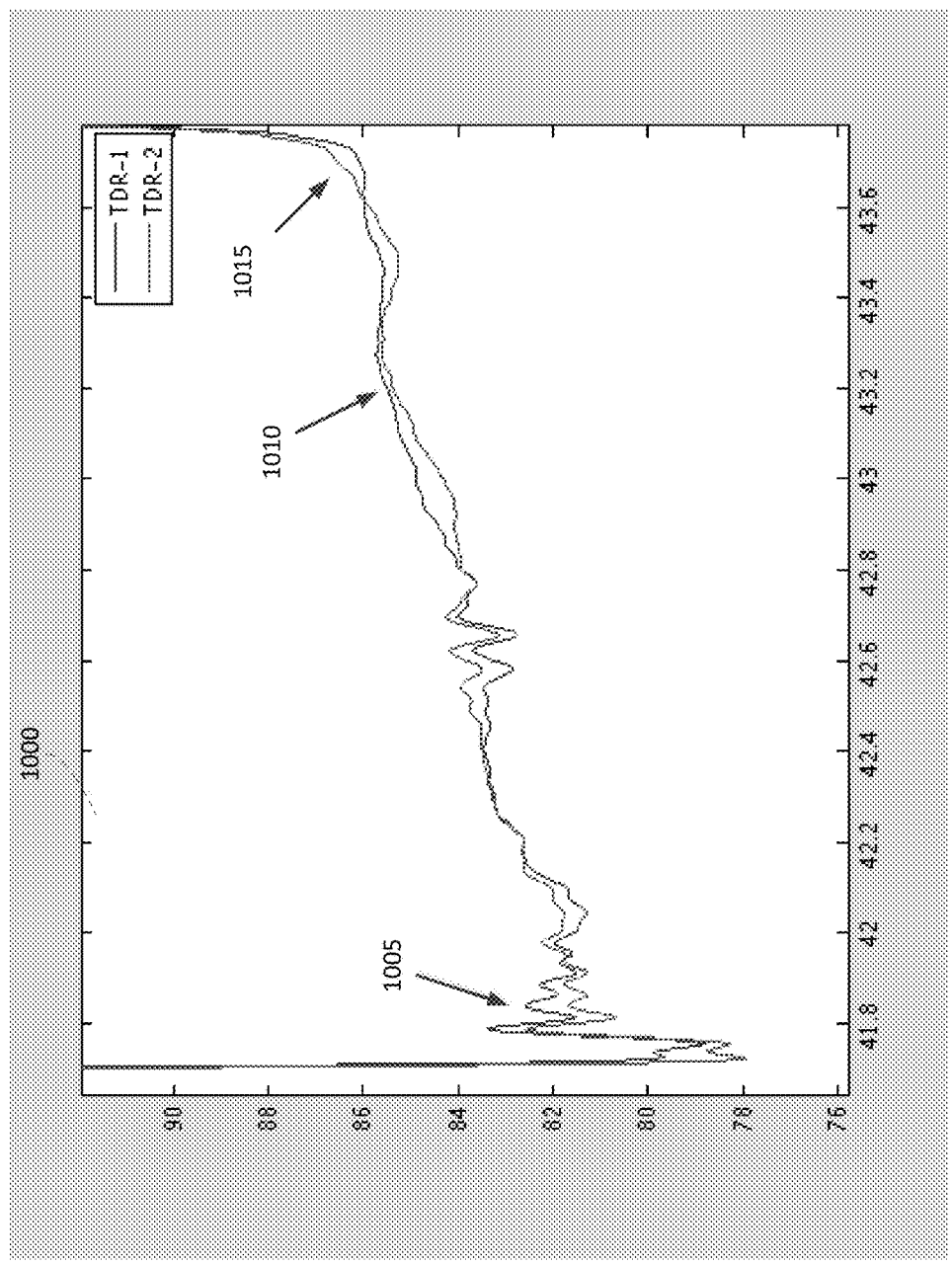
FIG. 10 is a simplified graph of impedance measurements of an electrical interconnect on a Printed Circuit Board (PCB), in accordance with an embodiment of the present disclosure.

Refer to the example embodiment of FIG. 10. FIG. 10 is a simplified graph of impedance measurements of an electrical interconnect on a Printed Circuit Board (PCB), in accordance with an embodiment of the present disclosure. As shown, graph 1000 shows measurements TDR-1 and TDR-2 of impedance on an electrical interconnect on a PCB. TDR-1 is measured from the beginning connection of an electrical interconnect and TDR-2 is measured from and end connection of the electrical interconnect. As shown, portion 1005 shows the noise created by attaching at TDR probe to an electrical interconnect to measure impedance. Portion 1015 shows the noise created an open circuit. In this embodiment, Portion 1010 shows a variation in impedance which shows a defect detected when conducting measurements TDR-1 and TDR-2.

Figure 11:
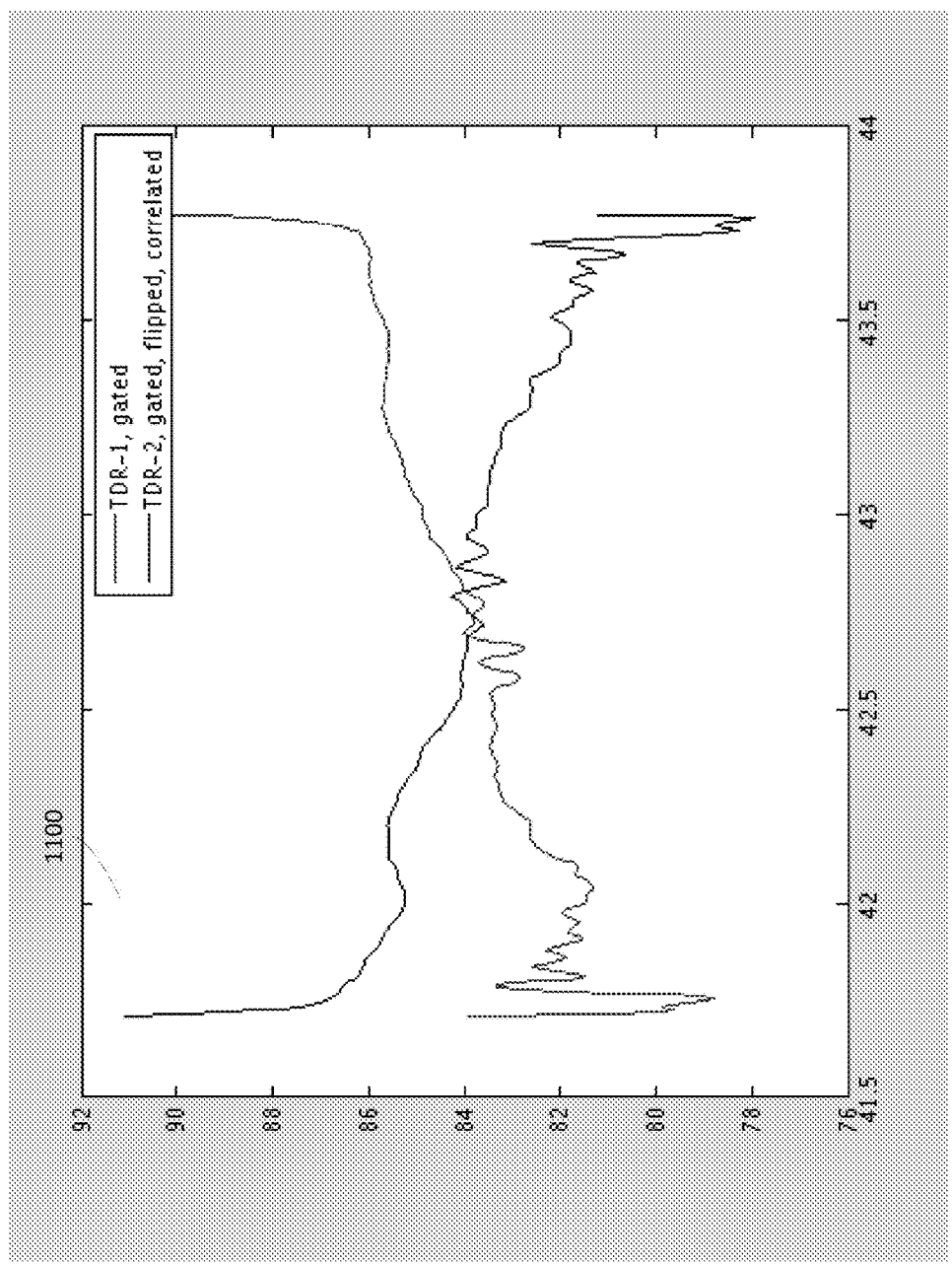
FIG. 11 is a simplified graph showing intermediary steps of processing impedance measurements of an electrical interconnect on a Printed circuit board (PCB), in accordance with an embodiment of the present disclosure.

Refer to the example embodiment of FIG. 11. FIG. 11 is a simplified graph showing intermediary steps of processing impedance measurements of an electrical interconnect on a Printed circuit board (PCB), in accordance with an embodiment of the present disclosure. Graph 900 shows measurements TDR-1 and TDR-2 of impedance on an electrical interconnect on a PCB. TDR-1 is measured from the beginning connection of an electrical interconnect and TDR-2 is measured from and end connection of the electrical interconnect. As shown, TDR-2 has been reflected across the vertical axis.

Figure 12:
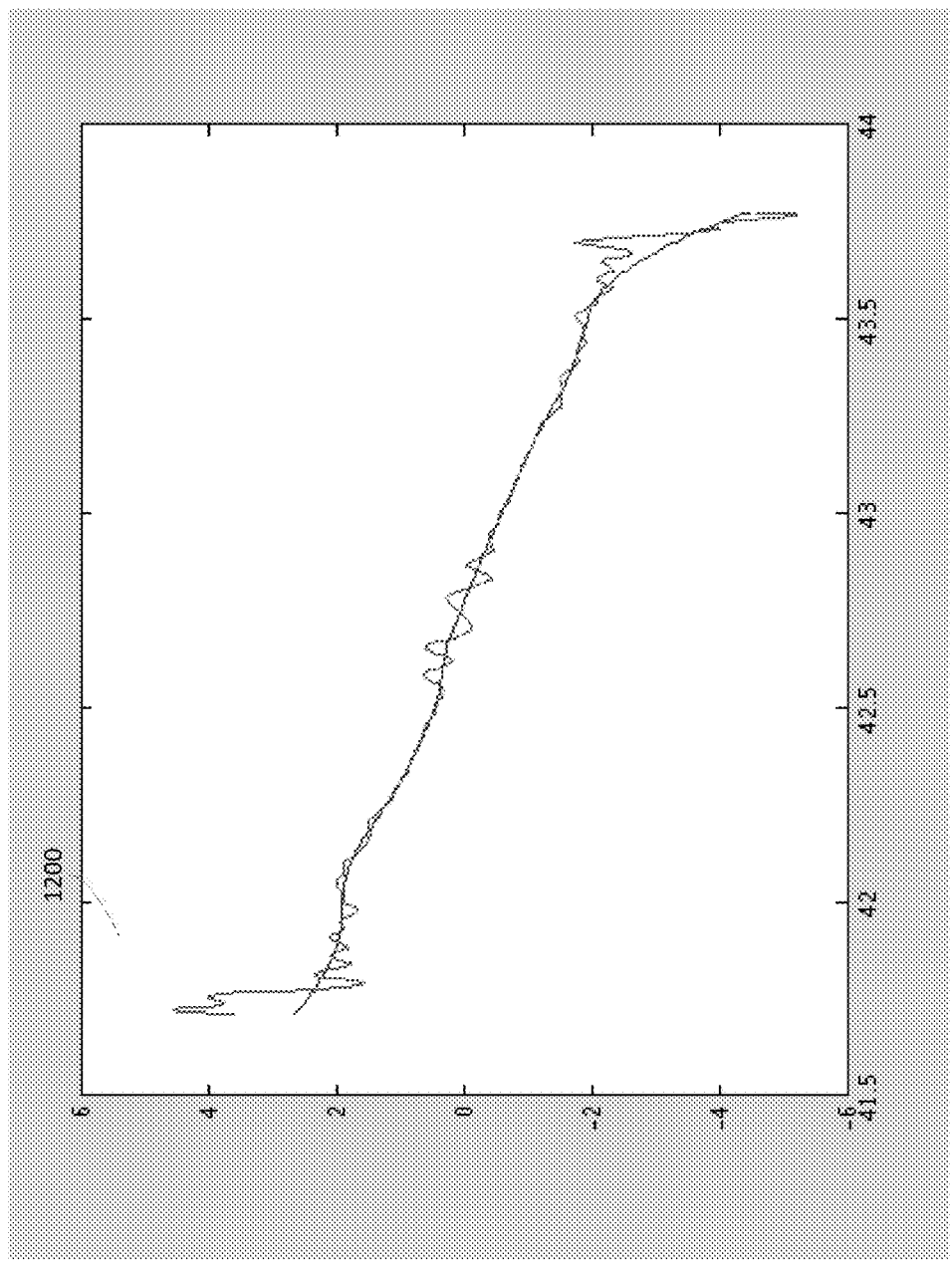
FIG. 12 is a simplified graph showing an intermediary step of processing impedance measurements of an electrical interconnect on a PCB, in accordance with an embodiment of the present disclosure.

Refer to the example embodiment of FIGS. 11 and 12. FIG. 12 is a simplified graph showing an intermediary step of processing impedance measurements of an electrical interconnect on a PCB, in accordance with an embodiment of the present disclosure. Graph 1100 shows the result of subtracting TDR-1 (FIG. 11) from TDR-2 (FIG. 11).

Figure 13:
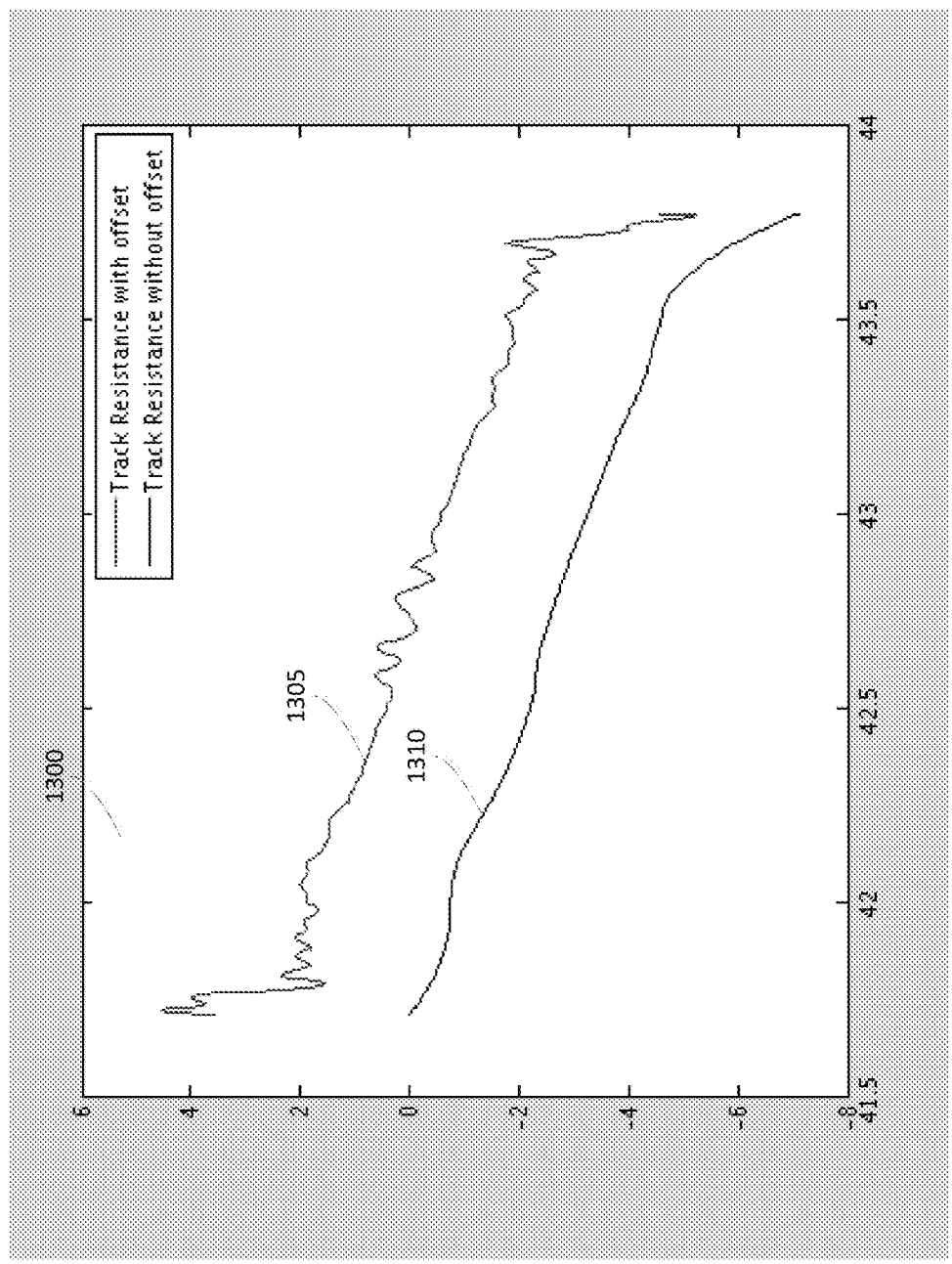
FIG. 13 is a simplified graph showing an intermediary step of processing impedance measurements of an electrical interconnect on a PCB, in accordance with an embodiment of the present disclosure.

Refer to the example embodiment of FIG. 13. FIG. 13 is a simplified graph showing an intermediary step of processing impedance measurements of an electrical interconnect on a PCB, in accordance with an embodiment of the present disclosure. Graph 1300 shows offset track resistance 1305 and smoothed track resistance without offset 1310. In many embodiments, track resistance without offsets may be used to remove noise in TDR measurements due to track resistance.

Figure 14:
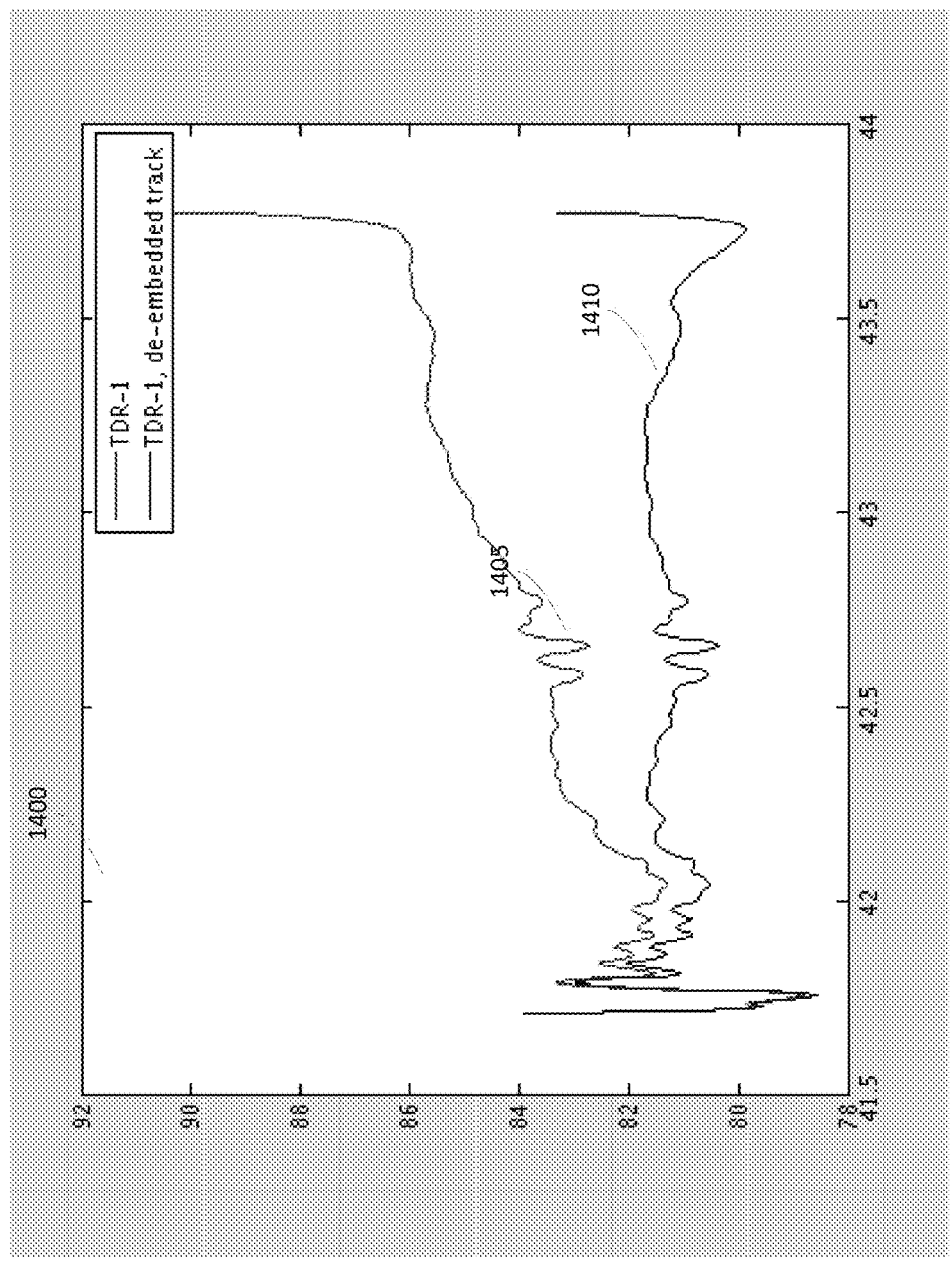
FIG. 14 is a simplified graph showing track resistance being removed from a TDR measurement, in accordance with an embodiment of the present disclosure.

Refer to the example embodiment of FIG. 14. FIG. 14 is a simplified graph showing track resistance being removed from a TDR measurement, in accordance with an embodiment of the present disclosure. Graph 1400 shows TDR measurement 1405 which is a raw measurement of an electrical interconnect without any modification. TDR measurement 1410 is TDR measurement 1405 with track resistance removed, which enables a user to view impedance and changes in impedance due to defects in an interconnect instead of increases in impedance due to track resistance.

Figure 15:
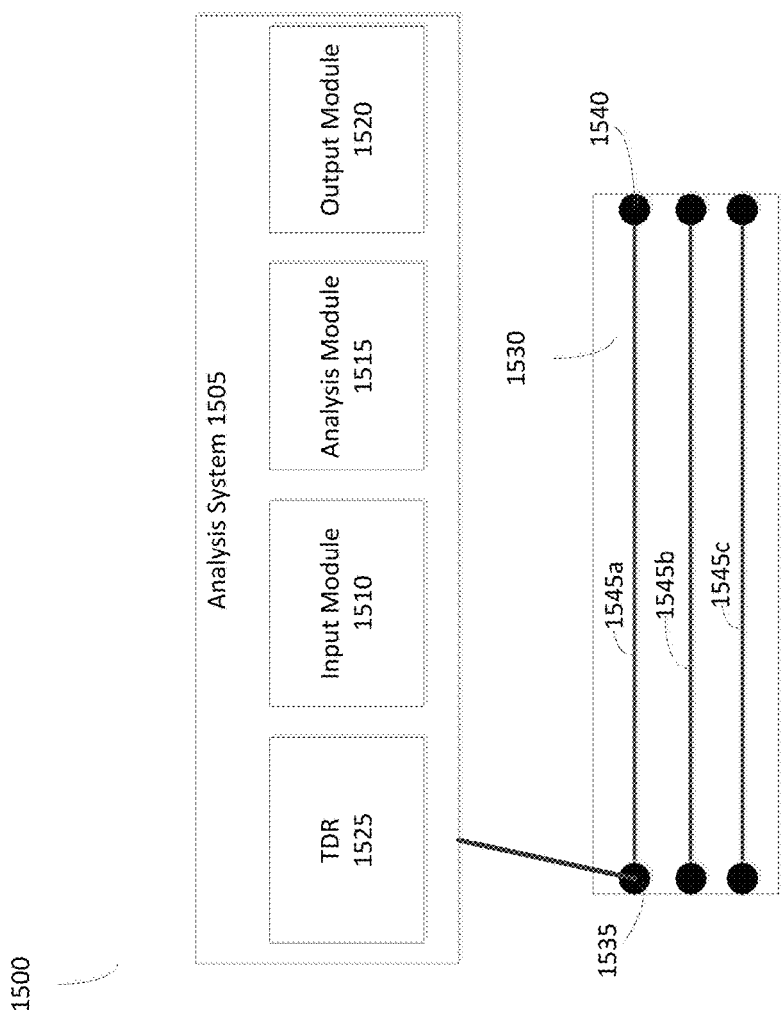
FIG. 15 is an alternate simplified illustration of an analysis system enabled to process impedance measurements from an electrical interconnect, in accordance with an embodiment of the present disclosure.

Refer to the example embodiment of FIG. 15. FIG. 15 is an alternate simplified illustration of an analysis system enabled to process impedance measurements from an electrical interconnect, in accordance with an embodiment of the present disclosure. As shown, Impedance Analysis System 1500 includes analysis system 1505. In this embodiment, analysis system 1505 includes TDR 1525, input module 1510, analysis module 1515, and output module 1520. As shown, TDR 1525 is coupled to PCB 1530. PCB 1530 includes electrical interconnects (1545*a-c*, 1545 Generally). Analysis system 1505 is enabled to measure impedance of electrical interconnect 1545*a* on PCB 1530 using connection 1535 and/or connection 1540. In this embodiment, Analysis module 1515 is enabled to analyze impedance measurements of interconnect 1545*a* to determine track resistance and remove track resistance from impedance measurements made by TDR 1525. In many embodiments, an analysis system may make a single measurement from a connection on an electrical interconnect to remove track resistance from a TDR measurement. In various embodiments, an analysis system may make two or more measurements from one or more connections on an electrical interconnect to remove track resistance from a TDR measurement.

Figure 16:
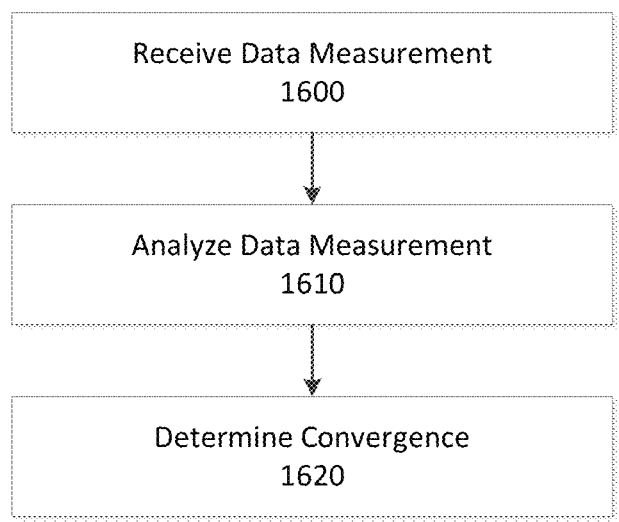
FIG. 16 is a simplified flowchart of a method of removing track resistance from a TDR measurement, in accordance with an embodiment of the present disclosure.

Refer to the example embodiments of FIGS. 2 and 16. FIG. 16 is a simplified flowchart of a method of removing track resistance from a TDR measurement, in accordance with an embodiment of the present disclosure. As shown, Impedance Analysis System 200 includes TDR 225 and analysis system 205. Analysis system 205 includes input module 210, analysis module 215, and output module 220. TDR 225 is measuring impedance of electrical interconnect 245*a* using connection 235*a* and provides the measured data to input module 210 in analysis system 205. Input module 210 receives data measurement (Step 1600) and provides the data measurement to analysis module 215. Analysis module 215 processes data measurement (Step 1610) by operating an Iteratively Re-Weighted Least Square (IRWLS) fit on the data measurement provided by TDR 225. Upon each iteration of the IRWLS, analysis module 215 determines whether the processed data meets convergence criteria (Step 1620). Analysis System 205 utilizes output module 220 to output results of the IRWLS fit on the data measurement.

Figure 17:
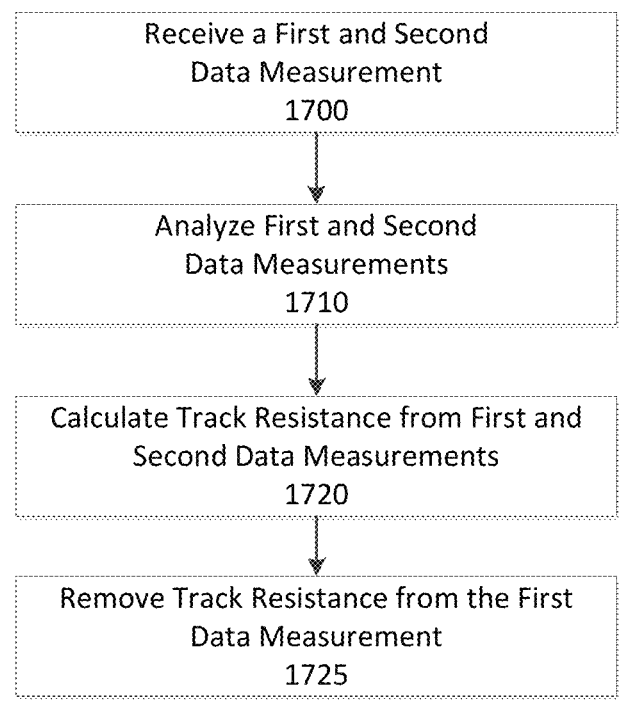
FIG. 17 is a simplified flowchart of a method of removing track resistance from impedance measurements, in accordance with an embodiment of the present disclosure.

Refer to the example embodiments of FIGS. 8 and 17. FIG. 17 is a simplified flowchart of a method of removing track resistance from impedance measurements, in accordance with an embodiment of the present disclosure. As shown, Impedance Analysis System 800 includes analysis system 805 and TDR 825. TDR 825 takes a first impedance measurement of interconnect 845*a* using connection 835 and TDR 825 takes a second impedance measurement of interconnect 854*a* using connection 840 (Step 1700). TDR 825 provides the first and second impedance measurement to analysis system 805 using input module 810. Input module 810 provides the first and second impedance measurement to analysis module 815. Analysis module 815 analyzes the first and second data measurements (Step 1710) and calculates the track resistance of interconnect 845*a* based on the first and second data measurements (Step 1720). Analysis module 815 utilizes calculated track resistance to remove track resistance from the first data measurement (Step 1725).

Figure 7B:
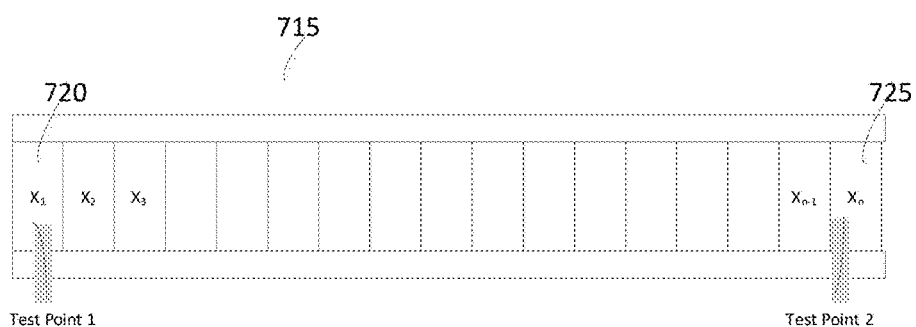
FIG. 7B is a simplified illustration of an electrical interconnect being analyzed, in accordance with an embodiment of the present disclosure.

Refer to the example embodiment of FIG. 7B. FIG. 7B is a simplified illustration of an electrical interconnect being analyzed, in accordance with an embodiment of the present disclosure. As shown, electrical interconnect 715 is divided into a plurality of portions. Electrical interconnect 710 is enabled to be measured from test point 1 720 and/or test point 2 725. Analysis using measurements from test point 1 720 and from test point 2 725 is enabled to be used to remove track resistance from measurements of electrical interconnect 715.

In an embodiment, measurements of an interconnect may be represented by portions $X_1$ through $X_n$ (as shown in FIG. 7B) which may be modeled by one or more equations. In this embodiment, a measurement taken from test point 1 (720, FIG. 7B) may be represented by equation 6.

$$\begin{bmatrix} m_1^{(1)} \\ m_2^{(1)} \\ m_3^{(1)} \\ \vdots \\ m_{n1}^{(1)} \end{bmatrix} = \begin{bmatrix} Z_0(X_1) + Z_{track}(X_1) \\ Z_0(X_2) + \sum_{n=1}^{2} Z_{track}(X_n) \\ Z_0(X_3) + \sum_{n=1}^{3} Z_{track}(X_n) \\ \vdots \\ Z_0(X_n) + \sum_{n=1}^{N} Z_{track}(X_n) \end{bmatrix} \quad \text{Equation (6)}$$

Measurements taken from Test Point 2 (725, FIG. 7B) may be represented by equation 7.

$$\begin{bmatrix} m_1^{(2)} \\ m_2^{(2)} \\ m_3^{(2)} \\ \vdots \\ m_{n1}^{(2)} \end{bmatrix} = \begin{bmatrix} Z_0(X_N) + Z_{track}(X_N) \\ Z_0(X_{N-1}) + \sum_{n=N-1}^{N} Z_{track}(X_n) \\ Z_0(X_{N-2}) + \sum_{n=N-2}^{N} Z_{track}(X_n) \\ \vdots \\ Z_0(X_1) + \sum_{n=1}^{N} Z_{track}(X_n) \end{bmatrix} \quad \text{Equation (7)}$$

In this embodiment, the measurements of represented in Equation 6 and Equation 7 can be represented as a system of linear equations.

$$2N \text{ measurement data points} \left\{ \begin{bmatrix} [m_1^{(1)}] \\ \vdots \\ [m_N^{(1)}] \\ [m_1^{(2)}] \\ \vdots \\ [m_N^{(2)}] \end{bmatrix} = \begin{bmatrix} 1 & 0 & \cdots & 0 \\ 0 & 1 & \cdots & 0 \\ \vdots & \vdots & \ddots & \vdots \\ 0 & 0 & \cdots & 1 \\ 0 & \cdots & 0 & 1 \\ 0 & \cdots & 1 & 0 \\ \vdots & \ddots & \vdots & \vdots \\ 1 & \cdots & 0 & 0 \end{bmatrix} \begin{bmatrix} 1 & 0 & \cdots & 0 \\ 1 & 1 & \cdots & 0 \\ \vdots & \vdots & \ddots & \vdots \\ 1 & 1 & \cdots & 1 \\ 0 & \cdots & 0 & 1 \\ 0 & \cdots & 1 & 1 \\ \vdots & \vdots & \vdots & \vdots \\ 1 & \cdots & 1 & 1 \end{bmatrix} \begin{bmatrix} Z_0(X_1) \\ \vdots \\ Z_0(X_N) \\ Z_{track}(X_1) \\ \vdots \\ Z_{track}(X_N) \end{bmatrix} \right\} 2N \text{ unknowns} \qquad \text{Equation (8)}$$

As shown, although there are as many unknowns as there are equations in equation 8, the system of equations cannot be solved with other noise present in the measurements, such as, but not limited to, measurement noise, ringing, reflection noise, and other sources of noise. In many embodiments, Equation 8 may be approximately solved if the system of equation 8 were over-determined (i.e. the number of unknowns is less than the number of measurements). In most embodiments, the system of equation 3 may be reduced by aggregating $Z_{track}$ terms as follows:

$Z_{track}(X_1) = \frac{1}{2}(Z_{track}(X_1) + Z_{track}(X_2)) = Z_{track}(X_2)$ $Z_{track}(X_3) = \frac{1}{2}(Z_{track}(X_3) + Z_{track}(X_4)) = Z_{track}(X_4)$

. . .

$Z_{track}(X_{N-1}) = \frac{1}{2}(Z_{track}(X_{N-1}) + Z_{track}(X_N)) = Z_{track}(X_N)$ Equation (9)

In most embodiments, two more $Z_{track}$ terms may be aggregated. In various embodiments, the assumptions of equation 4 may be reasonable since $Z_{track}$ may not change much between consecutive data points as localized variations in geometry may be within a range such that $Z_{track}$ may be insensitive to the change. In various embodiments, Equations 8 and Equations 9 may be combined into the following system of equations.

may mean that the probe at the beginning and open circuit at the end of the measurement be gated out. In certain embodiments, gating may ensure that the model described in equation 10 closely matches the impedance measurements of the specified interconnect.

In various embodiments, to make the estimation highly accurate, the two measurements may be correlated to ensure the first measurement, at each $X_n$, aligns with the second measurement at every $X_n$. In most embodiments, if the first and second measurements do not align well, each measurement may be time shifted by the optimal lag.

Figure 18:
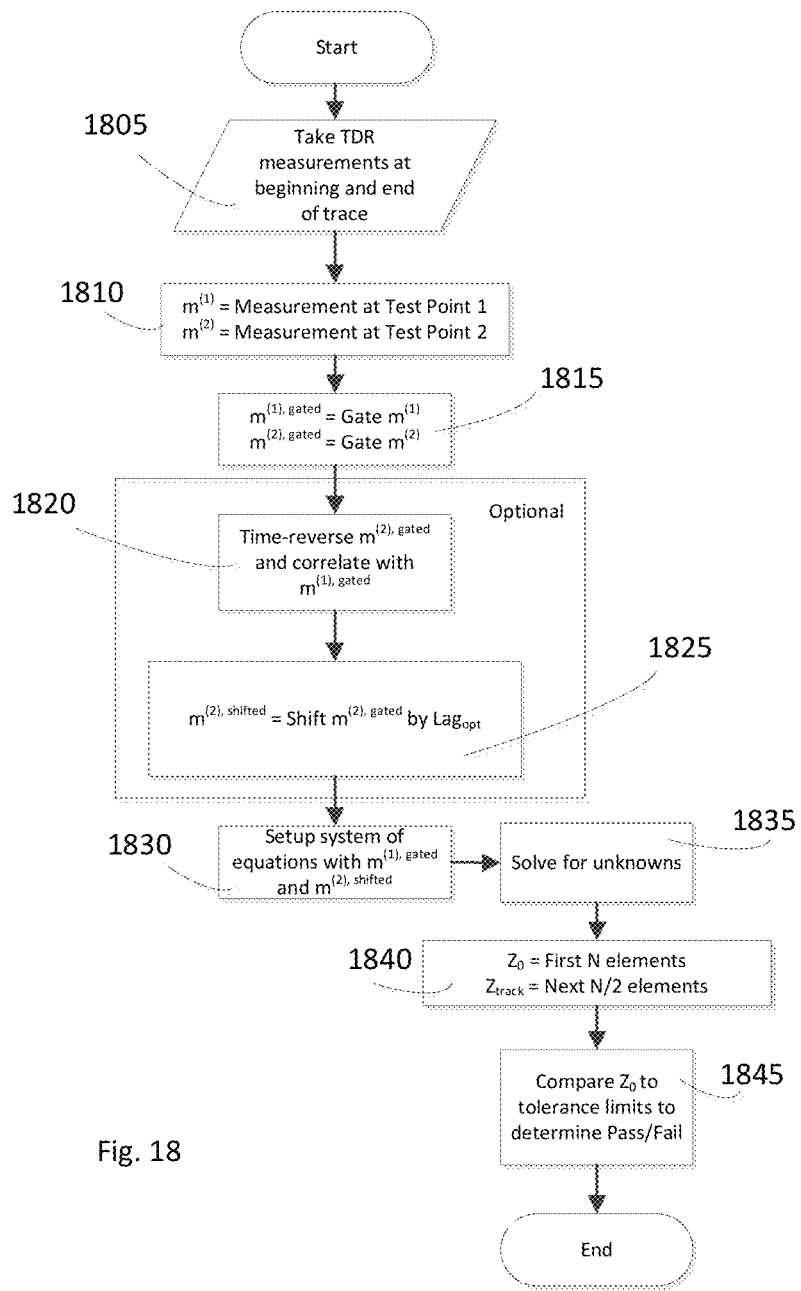
FIG. 18 is a simplified flowchart of a method of processing measured impedance of an electrical interconnect as shown in FIG. 8, in accordance with an embodiment of the present disclosure.

Refer to the example embodiments of FIGS. 8 and 18. FIG. 18 is a simplified flowchart of a method of processing measured impedance of an electrical interconnect as shown in FIG. 8, in accordance with an embodiment of the present disclosure. As shown, TDR 825 (FIG. 8) takes measurement $m^{(1)}$ of electrical interconnect 845*a* from connection 835 and takes measurement $m^{(2)}$ from connection 840 (Steps 1805 and 1810), where measurements of impedance are recorded over a period of time. TDR 825 communicates measurement data to analysis system 805. Analysis system 805 processes received measurement data using analysis module 815.

As shown, Analysis module 815 gates $m^{(1)}$ and $m^{(2)}$ by isolating impedance measurements from noise caused by the measurement probe and open portion of the electrical interconnect (Step 1815). Optionally, $m^{(2),gated}$ is time-reversed and correlated with $m^{(1),gated}$ (Step 1820). Upon determina- $$2N \text{ measurement data points} \left\{ \underbrace{\begin{bmatrix} [m_1^{(1)}] \\ \vdots \\ [m_N^{(1)}] \\ [m_1^{(2)}] \\ \vdots \\ [m_N^{(2)}] \end{bmatrix}}_{y} = \underbrace{\begin{bmatrix} 1 & 0 & \cdots & 0 \\ 0 & 1 & \cdots & 0 \\ \vdots & \vdots & \ddots & \vdots \\ 0 & 0 & \cdots & 1 \\ 0 & \cdots & 0 & 1 \\ 0 & \cdots & 1 & 0 \\ \vdots & \ddots & \vdots & \vdots \\ 1 & \cdots & 0 & 0 \end{bmatrix} \begin{bmatrix} 0.5 & 0 & \cdots & 0 \\ 1 & 0 & \cdots & 0 \\ 1 & 0.50 & \cdots & 0 \\ \vdots & \vdots & \ddots & \vdots \\ 1 & 1 & \cdots & 1 \\ 0 & \cdots & 0 & 0.5 \\ 0 & \cdots & 0 & 1 \\ 0 & \cdots & 0.50 & 1 \\ \vdots & \vdots & \vdots & \vdots \\ 1 & \cdots & 1 & 1 \end{bmatrix}}_{A} \underbrace{\begin{bmatrix} Z_0(X_1) \\ \vdots \\ Z_0(X_N) \\ Z_{track}(X_1) + Z_{track}(X_2) \\ \vdots \\ Z_{track}(X_{N-1}) + Z_{track}(X_N) \end{bmatrix}}_{x} \right\} 1.5N \text{ unknowns} \qquad \text{Equation (10)}$$

In many embodiments, Equation 10 may be approximately solved using a least squares method $\hat{x} = (A^T A)^{-1} A^T y$ Equation (11)

In various embodiments, the first N values from Equation 11 may be calculated to obtain the best estimate of $Z_0$.

In many embodiments, the current disclosure may require that the Device Under Test (DUT) measurement data may be contained in measurement vector y. In various embodiments, DUT measurement data contained in measurement vector y tion that $m^{(2),gated}$ is offset from $m^{(1),gated}$, $m^{(2),gated}$ is shifted by the offset value (Step 1825). Analysis module 815 sets up a system of equations with $m^{(1),gated}$ and $m^{(2),shifted}$ by aggregating two more $Z_{track}$ values (Step 1830) and solving for unknowns in the system of equations (Step 1835). Analysis module 815 stores the first N elements as $Z_0$ and stores the next N/2 elements as $Z_{track}$ (Step 1840). In this embodiment, Analysis module 815 compares $Z_0$ to predefined tolerance limits to determine whether the measured impedance measurements pass or fail Step 1845.

The methods and apparatus of this invention may take the form, at least partially, of program code (i.e., instructions) embodied in tangible non-transitory media, such as floppy diskettes, CD-ROMs, hard drives, random access or read only-memory, or any other machine-readable storage medium.

Figure 19:
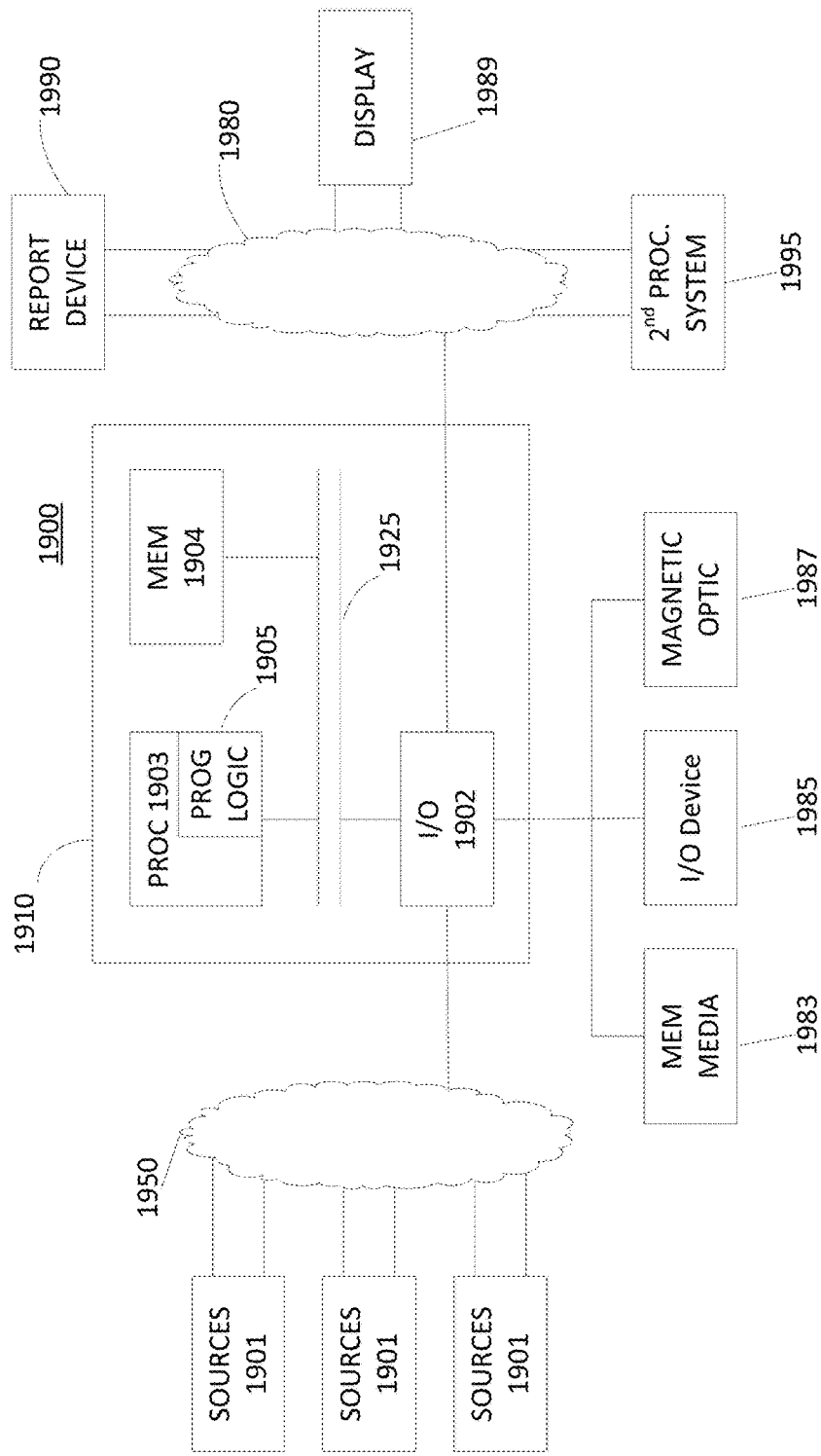
FIG. 19 is an example of an embodiment of an apparatus that may utilize the techniques described herein, in accordance with an embodiment of the present disclosure.

FIG. 19 is a block diagram illustrating an apparatus, such as a computer 1910 in a network 1900, which may utilize the techniques described herein according to an example embodiment of the present invention. The computer 1910 may include one or more I/O ports 1902, a processor 1903, and memory 1904, all of which may be connected by an interconnect 1925, such as a bus. Processor 1903 may include program logic 1905. The I/O port 1902 may provide connectivity to memory media 1983, I/O devices 1985, and drives 1987, such as magnetic or optical drives. When the program code is loaded into memory 1904 and executed by the computer 1910, the machine becomes an apparatus for practicing the invention. When implemented on one or more general-purpose processors 1903, the program code combines with such a processor to provide a unique apparatus that operates analogously to specific logic circuits. As such, a general purpose digital machine can be transformed into a special purpose digital machine.

Figure 20:
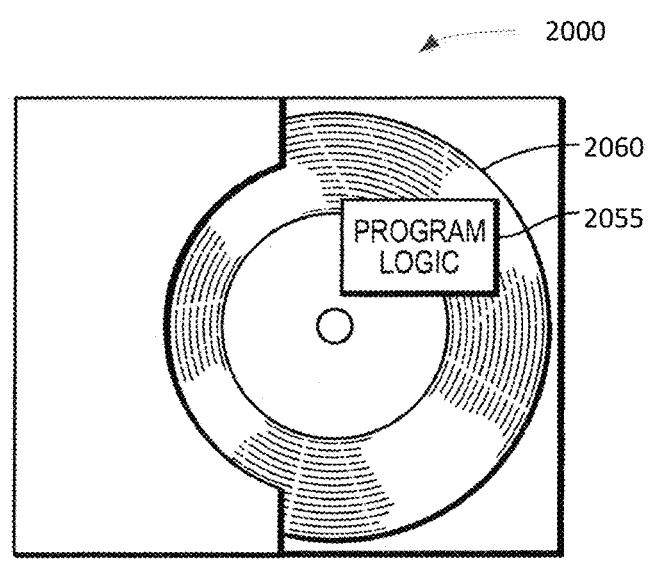
FIG. 20 is an example of a method embodied on a computer readable storage medium that may utilize the techniques described herein, in accordance with an embodiment of the present disclosure.

FIG. 20 is a block diagram illustrating a method embodied on a computer readable storage medium 2060 that may utilize the techniques described herein according to an example embodiment of the present invention. FIG. 20 shows Program Logic 2055 embodied on a computer-readable medium 2060 as shown, and wherein the Logic is encoded in computer-executable code configured for carrying out the methods of this invention and thereby forming a Computer Program Product 2000. Program Logic 2055 may be the same logic 1905 on memory 1904 loaded on processor 1903 in FIG. 19. The program logic may be embodied in software modules, as modules, as hardware modules, or on virtual machines.

The logic for carrying out the method may be embodied as part of the aforementioned system, which is useful for carrying out a method described with reference to embodiments shown in, for example, FIGS. 1-20. For purposes of illustrating the present invention, the invention is described as embodied in a specific configuration and using special logical arrangements, but one skilled in the art will appreciate that the device is not limited to the specific configuration but rather only by the claims included with this specification.

Although the foregoing invention has been described in some detail for purposes of clarity of understanding, it will be apparent that certain changes and modifications may be practiced within the scope of the appended claims. Accordingly, the present implementations are to be considered as illustrative and not restrictive, and the invention is not to be limited to the details given herein, but may be modified within the scope and equivalents of the appended claims.

What is claimed is:

1. A computer-executable method for detecting defects in an interconnect, using one or more processors and memory, the computer-executable method comprising:
   receiving, by an analysis module, a data measurement relating to the interconnect, wherein the data measurement is provided by a Time-Domain Reflectometer (TDR) to an analysis system comprising the analysis module and a output module, wherein the TDR is coupled to a Printed Circuit Board (PCB) comprising the interconnect;
   analyzing, by the analysis module, the data measurement;
   determining whether the interconnect includes a defect based on the analyzing of the data measurement;
   receiving a second data measurement relating to the interconnect;
   analyzing the second data measurement in relation to the data measurement;
   processing the data measurement and the second data measurement to remove a track resistance from the data measurement;
   updating the determination by isolating defects on the interconnect from the track resistance on the interconnect; and
   outputting, by the output module, the updated determination to detect defects in the interconnect.

2. The computer-executable method of claim 1, further comprising measuring the interconnect using the TDR to obtain the data measurement.

3. The computer-executable method of claim 1, wherein the analyzing includes:
   processing the data measurement; and
   determining whether the processed data measurement meets a convergence criteria.

4. The computer-executable method of claim 1, wherein the data measurement is a measurement of impedance of the interconnect.

5. A system, comprising:
   a Printed Circuit Board (PCB) containing an interconnect; and
   computer-executable program logic encoded in memory of one or more computers enabled to detect defects in the interconnect, wherein the computer-executable program logic is configured for the execution of, using one or more processors:
      receiving, by an analysis module, a data measurement relating to the interconnect, wherein the data measurement is provided by a Time-Domain Reflectometer (TDR) to an analysis system comprising the analysis module and an output module, wherein the TDR is coupled to the Printed Circuit Board (PCB) comprising the interconnect;
      analyzing, by the analysis module, the data measurement; and
      determining whether the interconnect includes a defect based on the analyzing of the data measurement;
      receiving a second data measurement relating to the interconnect;
      analyzing the second data measurement in relation to the data measurement; and
      processing the data measurement and the second data measurement to remove a track resistance from the data measurement;
      updating the determination by isolating defects on the interconnect from the track resistance on the interconnect; and
      outputting, by the output module, the updated determination to detect defects in the interconnect.

6. The system of claim 5, wherein the computer-executable program logic is further configured for the execution of measuring the interconnect using the TDR to obtain the data measurement.

7. The system of claim 5, wherein the analyzing includes:
   processing the data measurement; and
   determining whether the processed data measurement meets a convergence criteria.

8. The system of claim 5, wherein the data measurement is a measurement of impedance of the interconnect.

9. A computer program product for detecting defects in an interconnect, using one or more processors and memory, the computer program product comprising:
a non-transitory computer readable medium encoded with computer-executable code, the code configured to enable the execution of:
receiving, by an analysis module, a data measurement relating to the interconnect wherein the data measurement is provided by a Time-Domain Reflectometer (TDR) to an analysis system comprising the analysis module and an output module, wherein the TDR is coupled to a Printed Circuit Board (PCB) comprising the interconnect;
analyzing, by the analysis module, the data measurement;
determining whether the interconnect includes a defect based on the analyzing of the data measurement;
receiving a second data measurement relating to the interconnect;
analyzing the second data measurement in relation to the data measurement;
processing the data measurement and the second data measurement to remove a track resistance from the data measurement;
updating the determination by isolating defects on the interconnect from the track resistance on the interconnect; and
outputting, by the output module, the updated determination to detect defects in the interconnect.

10. The computer program product of claim 9, the code further configured to enable the execution of measuring the interconnect using TDR to obtain the data measurement.

11. The computer program product of claim 9, wherein the analyzing includes:
processing the data measurement; and
determining whether the processed data measurement meets a convergence criteria.

12. The computer program product of claim 9, wherein the data measurement is a measurement of impedance of the interconnect.

* * * * *